US009159608B2

(12) United States Patent  
Park et al.

(10) Patent No.: US 9,159,608 B2  
(45) Date of Patent: Oct. 13, 2015

(54) METHOD FOR FORMING TISIN THIN FILM LAYER BY USING ATOMIC LAYER DEPOSITION

(71) Applicant: AIXTRON SE, Herzogenrath (DE)

(72) Inventors: Woong Park, Kyeonggi-do (KR); Young Jin Jang, Kyeonggi-do (KR); Gi Youl Kim, San Jose, CA (US); Brian Lu, Fremont, CA (US); Greg Siu, Saratoga, CA (US); Hugo Silva, Aachen (DE); Sasangan Ramanathan, San Ramon, CA (US)

(73) Assignee: Aixtron SE, Herzogenrath (DE)

( * ) Notice: Subject to any disclaimer, the term of this patent is extended or adjusted under 35 U.S.C. 154(b) by 0 days.

(21) Appl. No.: 14/391,294

(22) PCT Filed: Apr. 8, 2013

(86) PCT No.: PCT/EP2013/057308  
§ 371 (c)(1),  
(2) Date: Oct. 8, 2014

(87) PCT Pub. No.: WO2013/153031  
PCT Pub. Date: Oct. 17, 2013

(65) Prior Publication Data  
US 2015/0050806 A1    Feb. 19, 2015

(30) Foreign Application Priority Data  
Apr. 9, 2012 (KR) .......... 10-2012-0036505

(51) Int. Cl.  
*H01L 21/768* (2006.01)  
*H01L 21/285* (2006.01)  
*H01L 21/02* (2006.01)  
*C23C 16/02* (2006.01)  
(Continued)

(52) U.S. Cl.  
CPC ...... *H01L 21/76841* (2013.01); *C23C 16/0209* (2013.01); *C23C 16/34* (2013.01);  
(Continued)

(58) Field of Classification Search  
CPC .................................................. H01L 21/0228  
See application file for complete search history.

(56) References Cited

U.S. PATENT DOCUMENTS 6,958,296 B2 * 10/2005 Chen et al. ..................... 438/706  
2003/0143841 A1 * 7/2003 Yang et al. ..................... 438/656  
(Continued)

*Primary Examiner* — Angel Roman  
(74) *Attorney, Agent, or Firm* — Ascenda Law Group, PC

(57) ABSTRACT

There is disclosed a method for forming a TiSiN thin film on a substrate according to ALD including a first process of preheating a substrate while supplying Ar or $N_2$ containing inert gas to a chamber, after disposing a substrate in a chamber; a second process of forming a TiN film on the substrate by repeating at least one time a process of purging over-supplied Ti containing gas after supplying Ti containing gas and inert gas after that and a process of purging residual product after supplying N containing gas and inert gas after that; a third process of forming a SiN film by repeating at least one time a process of purging over-supplied Si containing gas after supplying Si containing gas on the TiN film and supplying inert gas after that and a process of purging residual product after supplying N containing gas and supplying inert gas after that; and a fourth process of forming a TiSiN film having a desired thickness by repeating the second and third processes at least one time, a partial pressure range of the gas used in forming the TiSiN thin film is Ti containing gas: $9\times10^{-3}$ Torr or less, Si containing gas: $1\times10^{-3}\sim3\times10^{-1}$ Torr and N containing gas: $7\times10^{-3}\sim6\times10^{-1}$ Torr, and a pressure range of the gas is 500 mTorr~5 Torr and the Si content of the formed TiSiN thin film is 20 atom % or less.

7 Claims, 8 Drawing Sheets

(51) Int. Cl.
*C23C 16/34* (2006.01)
*C23C 16/455* (2006.01)

(52) U.S. Cl.
CPC ..... *C23C16/45529* (2013.01); *C23C 16/45531* (2013.01); *H01L 21/0228* (2013.01); *H01L 21/28556* (2013.01); *H01L 21/28562* (2013.01); *H01L 21/28568* (2013.01); *H01L 21/76843* (2013.01)

(56) References Cited

U.S. PATENT DOCUMENTS

2003/0214043 A1\* 11/2003 Saitoh et al. .................. 257/758
2005/0054196 A1\* 3/2005 Wu et al. ........................ 438/680
2006/0182885 A1\* 8/2006 Lei et al. ..................... 427/248.1

\* cited by examiner

|  | TiN(x times) | | | | | | |
|---|---|---|---|---|---|---|---|
|  | TiN(x times) | | | SiN(y times) | | | |
| Ti Containing Gas | ■ | | | | | | |
| Si Containing Gas | | | | ■ | | | |
| N Containing Gas | | | ■ | | | ■ | |
| Inert Gas | | ■ | | ■ | | | ■ |

| TiSiN_1 |
|---------|
| TiSiN_2 |
| TiSiN_3 |

METHOD FOR FORMING TISIN THIN FILM LAYER BY USING ATOMIC LAYER DEPOSITION

CROSS REFERENCE TO RELATED APPLICATIONS

This is a NATIONAL STAGE under 35 USC 371 of and claims priority to International Application PCT/EP2013/057308, filed 8 Apr. 2013, incorporated herein by reference, which claims priority to KR 10-2012-0036505 filed 9 Apr. 2012.

TECHNICAL FIELD

Embodiments of the invention may relate to a method for forming a TiSiN thin layer by using atomic layer deposition (ALD), and more particularly, to a method for forming a TiSiN thin layer that is a diffusion barrier layer between a conductive bottom layer and a top conductive layer by using atomic layer deposition.

BACKGROUND

Generally, membrane and pattern etching are repeatedly performed on a substrate such as a semiconductor wafer, and a plurality of desired devices are manufactured to manufacture a semiconductor integrated circuit.

To prevent interdiffusion between a material of a wire for connecting devices with each other and silicon diffused from a substrate such as a bottom layer or a Si-containing layer, barrier metal is typically disposed between a bottom layer and a wire. Such barrier metal has to be a metallic material having low electric resistance and high anticorrosion. A barrier metallic material capable of meeting such requirements mentioned above, such as an aluminum or tungsten wire that is currently used as a wire material, may be a high melting point metallic nitride, for example, Ti, W and Mo. A Ti or TiN film having electric and anticorrosive characteristics has been used as the barrier metallic material.

The Ti film or TiN film as the barrier metal is typically formed in a high temperature range of 500° C.~700° C. according to chemical vapor deposition (CVD). The Ti or TiN may be effectively embedded in a contact hole or via-hole having a high aspect ratio and it has a good character with respect to aluminum or tungsten that is a wire material.

Recent demands on high integration and high microstructure of the integrated circuit have made the line width of wires get narrower. High operation efficiency as well as the high integration mentioned above is required. Under such situation, copper (Cu) with low resistivity and economic feasibility has been attracting attention as the wire material that can replace the aluminum. However, as mentioned above, the copper is vulnerable to migration with silicon like aluminum and to being diffused at a relatively low temperature. Accordingly, the copper (Cu) has an inadequate barrier capacity as the metal used in the Ti or TiN film.

Korean Patent No. 10-2009-0048523 discloses a method for using a TiSiN film deposited according to plasma CVD or thermal CVD to solve the disadvantage of the conventional Ti or TiN film. However, the concentration of chlorine and oxygen that are impurities contained in the TiSiN film deposited according to the chemical deposition method is high as shown in FIG. 1. Accordingly, a leakage current characteristic of a thin film manufactured might be deteriorated by the impurities.

As a result, there have been studied a method for forming a film having a reduced content of impurities contained in a manufactured TiSiN thin film.

DISCLOSURE

Technical Problem

To solve the problems, an object of the invention is to provide a method for forming TiSiN thin film having a good leakage current characteristic by using atomic layer deposition (ALD).

Technical Solution

To achieve these objects and other advantages and in accordance with the purpose of the embodiments, as embodied and broadly described herein, a method for forming a TiSiN thin film on a substrate according to ALD includes the following processes:

There may be a first process of preheating a substrate while supplying Ar or $N_2$ containing inert gas to a chamber, after disposing a substrate in a chamber.

There may be a second process of forming a TiN film on the substrate by repeating at least one time a process of purging over-supplied Ti containing gas after supplying Ti containing gas and inert gas after that and a process of purging residual product after supplying N containing gas and inert gas after that.

There may be a third process of forming a SiN film by repeating at least one time a process of purging oversupplied Si containing gas after supplying Si containing gas on the TiN film and supplying inert gas after that and a process of purging residual product after supplying N containing gas and supplying inert gas after that.

There may be a fourth process of forming a TiSiN film having a desired thickness by repeating the second and third processes at least one time.

A partial pressure range of the gas used in forming the TiSiN thin film may be Ti containing gas: $9 \times 10^{-3}$ Torr or less, Si containing gas: $1 \times 10^{-3}$~$3 \times 10^{-1}$ Torr and N containing gas: $7 \times 10^{-3}$~$6 \times 10^{-1}$ Torr, and a pressure range of the gas may be 500 mTorr~5 Torr and the Si content of the formed TiSiN thin film may be 20 atom % or less.

The Ti containing gas may be $TiCl_4$, TDMAT or TDEAT.

The Si containing gas may be $SiH_2Cl_2$, $SiHCl_3$, $SiCl_4$, $SiH_4$ or $Si_2H_6$.

The N containing gas may be $NH_3$ or MMH.

A preheating temperature in the preheating process may be 400° C.~700° C. and a preheating pressure may be 0.5 mTorr~5 Torr.

A partial pressure of the Ti containing gas may be $6 \times 10^{-4}$ Torr or less.

The temperature of a bubbler in the supply of the Ti containing gas is maintained at 0° C.~15° C.

Advantageous Effects

The embodiments have following advantageous effects. According to the method for forming the TiSiN, the TiSiN film as barrier metal may be manufactured according to ALD effectively. The barrier metal such as TiSiN is employed to suppress reaction between the metallic top layer and the metallic bottom layer and it is important for the barrier metal to maintain a low resistivity, with suppressing the reaction.

According to the method, the partial pressure of the Ti containing gas is controlled in an adequate range in the manufacturing process. Simultaneously, the Si content in the manufactured thin film is controlled to be an adequate value or less. Accordingly, there may be an advantage of manufacturing a TiSiN film.

BRIEF DESCRIPTION OF THE DRAWINGS

Arrangements and embodiments may be described in detail with reference to the following drawings in which like reference numerals refer to like elements and wherein.

BEST MODE

Embodiments will be described in detail to be embodied by those skilled in the art to which the embodiments pertain to, in reference to the accompanying drawings. Reference may now be made in detail to specific embodiments, examples of which may be illustrated in the accompanying drawings.

Embodiments of the invention relate to a method for forming a TiSiN thin film as a diffusion barrier layer between a bottom layer and a top layer that are conductors. In reference to the accompanying drawings, the embodiments will be described in detail as follows.

Figure 1:
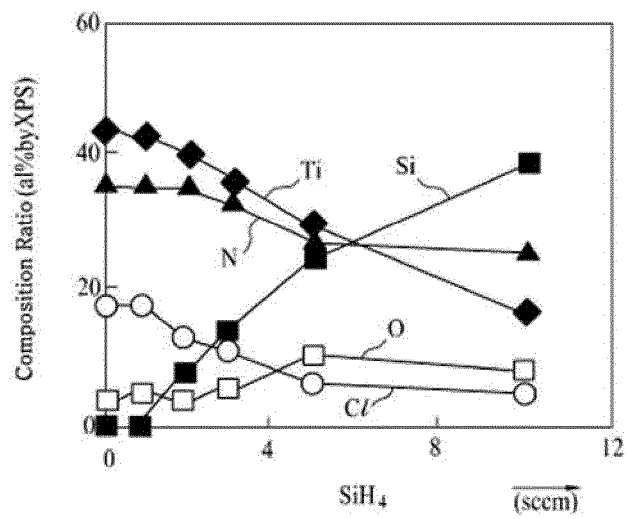
FIG. 1 is a graph showing the concentration of chloride and oxygen that are impurities contained in a TiSiN film deposited according to a chemical deposition method.
Figure 2:
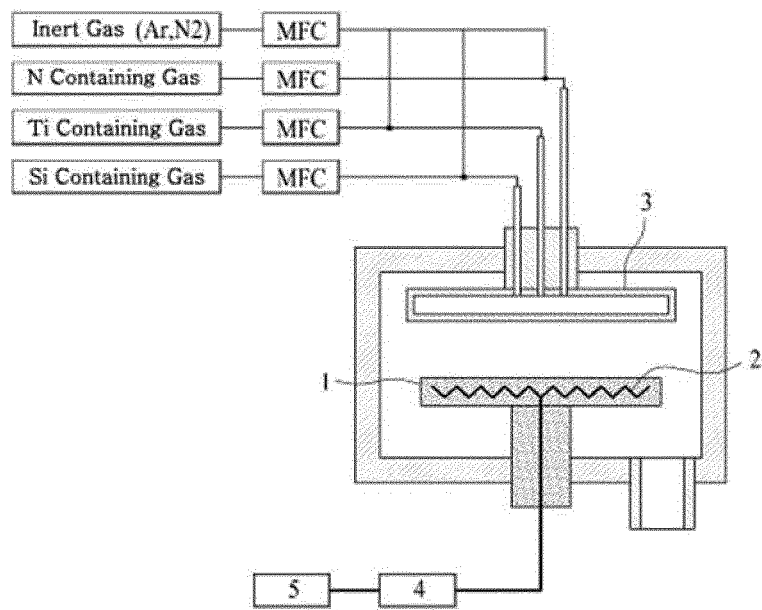
FIG. 2 is a block diagram schematically illustrating an atomic layer deposition apparatus used in a manufacturing process according to an embodiment of the invention.

FIG. 2 is a block diagram schematically illustrating an atomic layer deposition device used in a manufacturing process according to an embodiment of the invention. As shown in FIG. 2, the atomic layer deposition apparatus includes a susceptor 1 provided in a reactor, and a heater 2 to arrange a semiconductor wafer thereon is embedded in the susceptor 1. A power source 4 is supplied to the heater and the heater 2 is employed to heat the semiconductor wafer to a desired temperature. Also, the power source 4 is connected to a controller 5 and the controller 5 can control output of the heater 2 based on a signal of a temperature sensor.

In addition, a shower head 3 is installed beyond the reactor, and the gas necessary for deposition is supplied from the shower head 3. The shower head 3 has internal independent paths to supply Ti-containing gas, Si-containing gas and N-containing gas independently such that each of the gases may meet after being injected from the shower head.

Figure 3:
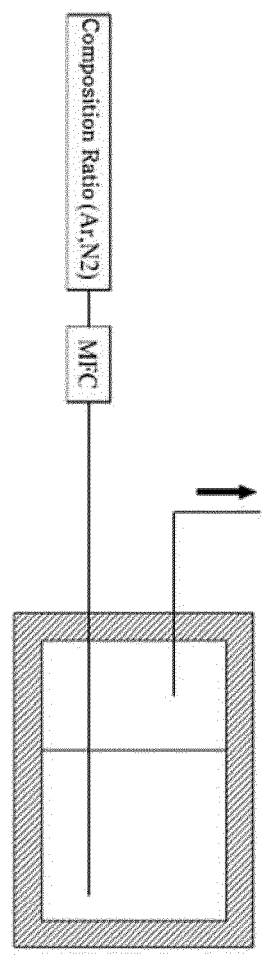
FIG. 3 is a block diagram schematically illustrating a method for supplying Ti-containing gas.

Meanwhile, FIG. 3 illustrates a method for supplying the Ti-containing gas.

As shown in FIG. 3, the Ti-containing gas may be supplied by a bubbler and the temperature of the bubbler may be kept between 0° C.~15° C. by using a thermostat, to enable the Ti-containing gas to have a desired vapor pressure. An inert gas supplied by a mass flow meter is received in a container having a predetermined temperature kept by the thermostat and the inert gas is supplied to the atomic layer deposition apparatus, together with the Ti-containing gas generated from a liquid phase chemical.

Figures 4, 5:
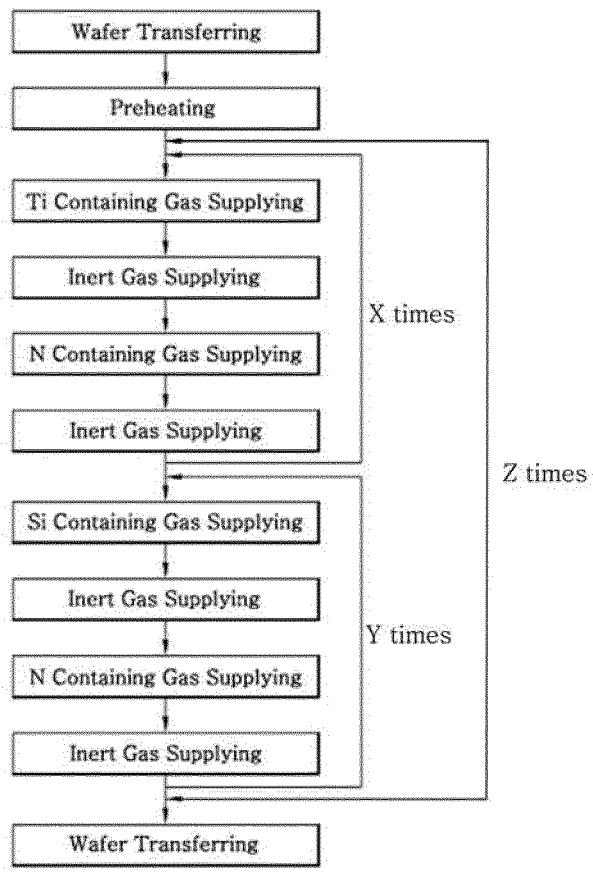
FIG. 4 is a flow chart illustrating the manufacturing process according to the embodiment of the invention.
FIG. 5 is a diagram illustrating a TiSiN thin film formed in the manufacturing process.

As shown in FIG. 4, after a substrate is disposed in a chamber, argon (Ar) or nitrogen ($N_2$) containing inert gas is supplied to the chamber and the substrate is preheated.

In other words, when the wafer transferred to a wafer transfer apparatus is disposed on the susceptor 1 having the heater 2 embedded therein, the wafer is preheated for a predetermined time period, for example, 30 seconds to 2 minutes. Shortly, the cold wafer is preheated, with flowing the inert gas such as Ar or $N_2$ at 0.5 mTorr to 5 Torr, until it has a desired temperature. In this instance, the temperature of the susceptor 1 may be maintained in a grange of 400° C. to 700° C.

Hence, after the Ti-containing gas is supplied on the substrate and the inert gas is supplied, over-supplied Ti containing gas is purged. The process of purging residual products by using the inert gas supplied after the N-containing gas is supplied may be repeated one time or more, to form a TiN film on the substrate.

In other words, the Ti containing gas is supplied on the substrate for a predetermined time period in a range of 0.4~60 seconds and the inert gas is supplied for a predetermined time period in a range of 0.4~60 seconds after that, only to purge oversupplied $TiCl_4$ gas. After that, the N containing gas is supplied for a predetermined time in a range of 0.4~60 seconds and the inert gas is supplied for a predetermined time in a range of 0.4~60 seconds, to remove the residual products. Accordingly, the TiN thin film is formed. That process is repeated x times and a TiN thin film having a desired thickness is formed.

The Ti containing gas may be $TiCl_4$, TDMAT or TDEAT. The N containing gas may be $NH_3$ or MMH. The inert gas may be argon or nitrogen.

According to the embodiment of the invention, after Si containing gas is supplied on the formed TiN film and inert gas is supplied, oversupplied Si containing gas is purged. Hence, after N containing gas is supplied and inert gas is supplied, residual products are purged. That process is repeated one time or more and a TiSiN film is formed accordingly.

In other words, the Si containing gas is supplied on the TiN thin film formed in the process mentioned above and the inert gas is supplied for a predetermined time in a range of 0.4~60 seconds, to purge the oversupplied Si containing gas. The N containing gas is supplied for a predetermined time in a range of 0.4~60 seconds and the inert gas is supplied for a predetermined time in a range of 0.4~60 seconds to purge the residual products to form the SiN film. That process is repeated y times and a SiN film having a desired thickness is formed accordingly.

In the process mentioned above, the Si containing gas may be $SiH_2Cl_2$, $SiHCl_3$, $SiCl_4$, $SiH_4$ or $Si_2H_6$. The N containing gas is the same as mentioned above.

Hence, the process of forming the TiN and SiN films is repeated one time or more and a TiSiN thin film may be formed finally. In other words, when that process is repeated z times, a TiSiN thin film having a desired thickness may be formed.

FIG. 5 is a picture illustrating those processes.

Meanwhile, a partial pressure range of the gas used for manufacturing the TiSiN thin film according to the invention described above will be as follows.

In other words, a partial pressure range of the Ti containing gas may be $9 \times 10^{-3}$ Torr or less, preferably, $6 \times 10^{-4}$ Torr or less. A partial pressure range of the Si containing gas may be in a range of $1 \times 10^{-3} \sim 3 \times 10^{-1}$ Torr and a partial pressure range of the N containing gas may be in a range of $7 \times 10^{-3} \sim 6 \times 10^{-1}$ Torr. A pressure range may be 500 mTorr~5 Torr.

As mentioned above, the TiSiN film as a barrier metal is required to have less impurity such as chloride and a relatively low resistivity that can be different based on an application scope of the TiSiN film to suppress reaction between the metallic bottom layer and the metallic top layer.

Considering that, the invention limits the partial pressure of the Ti containing gas to be $9 \times 10^{-3}$ Torr or less, preferably, $6 \times 10^{-4}$ Torr or less. Within such a range, the TiSiN film having an effectively low resistivity can be gained.

In addition, the invention requires that the Si content of the TiSiN thin film formed in the manufacturing process should be 20% of the atoms or less and a low resistivity can be guaranteed in such a range.

The embodiments of the invention will be described in detail as follows.

First Embodiment

In this embodiment, the Si content in the formed TiSiN film may be adjusted and Table 1 shows four methods for adjusting the Si content in the TiSiN film and the result of RBS analysis performed with respect to the Si content in the TiSiN film deposited according to each of the four methods.

TABLE 1

|  | TiN[x]/ SiN[y] | DCS Partial Pressure [Torr] | DCS Supply Time [sec.] | Si Content (Atom %) |
|---|---|---|---|---|
| DCS Supply Time [sec.] | 7 | 0.1 | 4 | 9 |
|  | 7 | 0.1 | 8 | 15 |
|  | 7 | 0.1 | 17 | 16 |
| DCS Supply Flow | 7 | 0.18 | 8 | 17 |
|  | 7 | 0.29 | 8 | 20 |
| TiN Frequency [x times]/ SiN Frequency [y times] | 10 | 0.1 | 8 | 12 |
|  | 12 | 0.1 | 8 | 10 |
|  | 28 | 0.1 | 8 | 5 |

In Table 1, "DCS" refers to $SiH_2Cl_2$ as the Si containing gas.

A first method is a method for increasing the Si content in proportion to the DCS supply time. A second method is a method for increasing the Si content in proportion to the DCS supply flow. A third method is a method for increasing the Si content in inverse proportion to the TiN deposition frequency (x times)/SiN deposition frequency (y times).

Second Embodiment

Table 2 shows the Cl content in a TiSiN film according to a deposition condition.

TABLE 2

| Susceptor Temperature (° C.) | Si | Ti | N | Cl |
|---|---|---|---|---|
| 600 | 17.3 | 28.6 | 53.8 | <0.3 |
| 550 | 12.7 | 32.3 | 55 | <0.3 |
| 500 | 11 | 32.7 | 56 | <0.3 |
| 450 | 10 | 36 | 53.7 | <0.3 |
| 600 | 10.5 | 32.5 | 56.7 | <0.3 |
| 600 | 4 | 48.5 | 47.2 | <0.3 |

Generally, the Cl contained in the diffusion preventing layer tends to degrade a characteristic of the diffusion barrier layer and a characteristic of the device having the diffusion barrier layer applied thereto. However, the Cl content at temperatures applied to the TiSiN film deposited in the range of the process according to the present invention and in all range of the Si content may have an adequate film characteristic under a detection limit of RBS analysis.

Third Embodiment

Figure 6A:
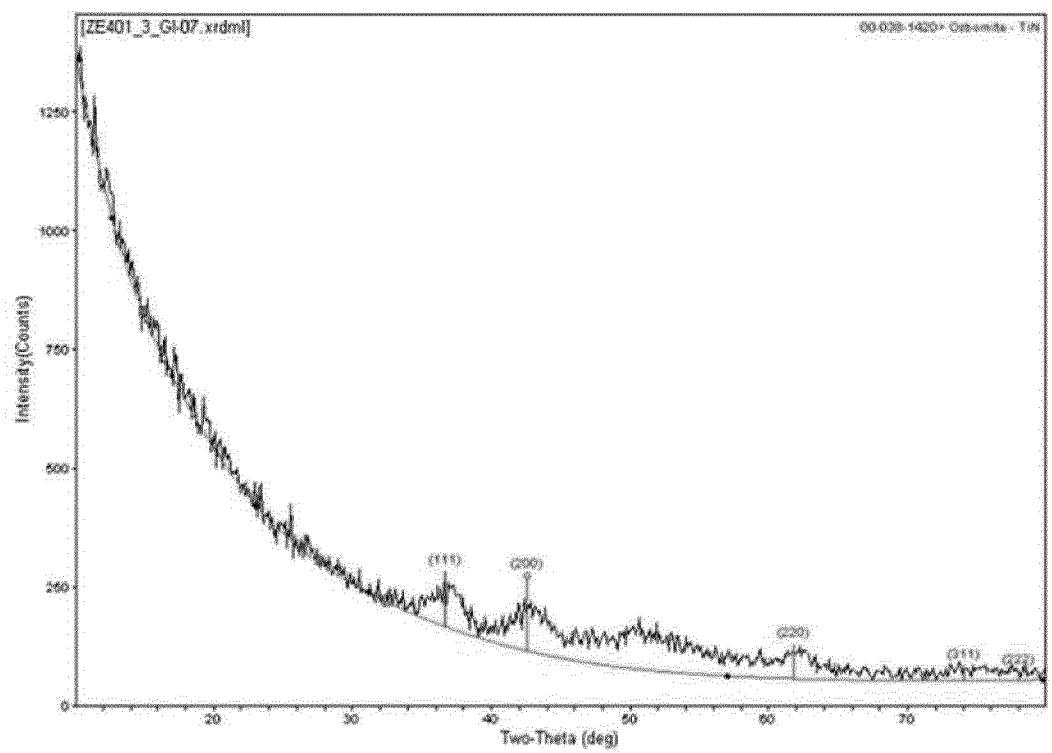
FIGS. 6(a) and 6(b) are graphs showing the result of XRD analysis according to the content of Si in the TiSiN film manufactured according to the method.
Figure 6B:
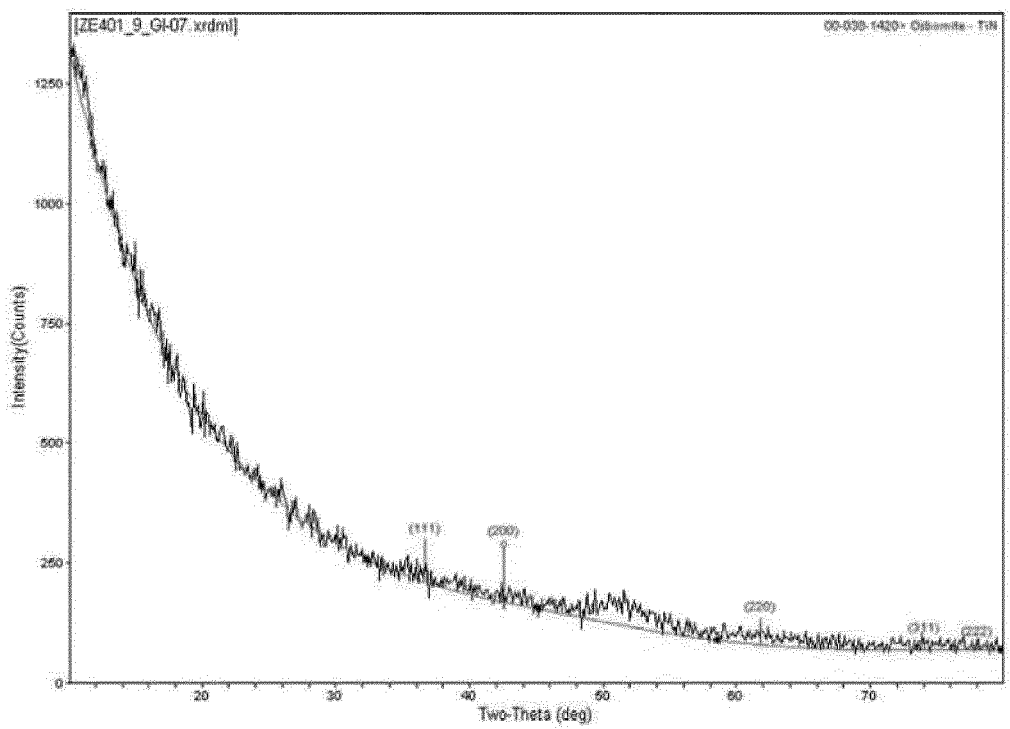

FIGS. 6(a) and 6(b) show the result of XRD analysis according to the Si content in the TiSiN film manufactured according to the invention. Specifically, FIG. 6(a) shows the result of XRD analysis performed with respect to the TiSiN film having 4% of the Si content. FIG. 6(a) shows a crystalline TiSiN film having a TiN (111), TiN (200) and TiN (220) direction crystallinity. FIG. 6(b) shows an amorphous TiSiN film as the result of XRD analysis performed with respect to a TiSiN film having 20% of the Si content. Accordingly, as the Si content is increasing in the TiSiN film, the crystalline TiSiN film is changed into the amorphous TiSiN film.

Figure 7A:
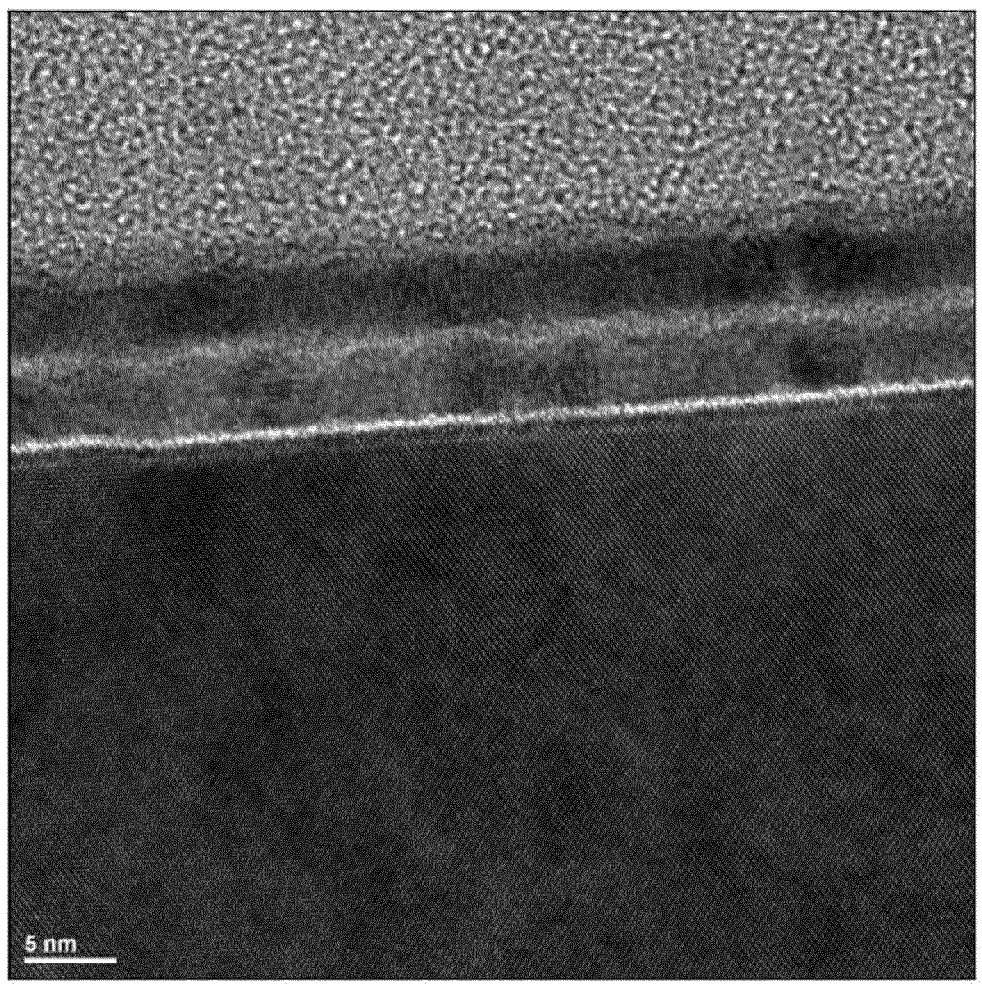
FIGS. 7(a) and 7(b) are photographs of TEM analysis of XRD specimens analyzed in FIGS. 6(a) and 6(b)
Figures 7B, 8:
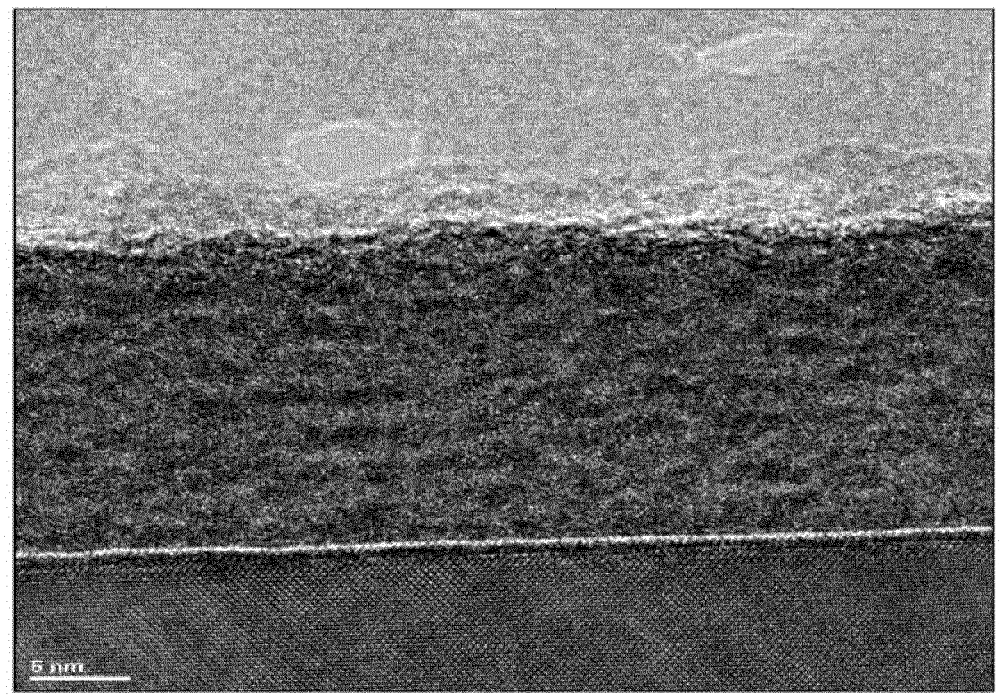
FIG. 8 is a sectional view conceptually illustrating the TiSiN film manufactured in the manufacturing process.

Meanwhile, FIGS. 7(a) and 7(b) show the results of TEM analysis of XRD specimens analyzed in FIGS. 6(a) and 6(b) and they support the XRD result related to the crystallinity of the TiSiN film according to the Si content.

Fourth Embodiment

The TiSiN film according to the invention may be deposited to have the same Si content according to the thickness or to have a different Si content. Following Table 3 to 5 are process conditions showing a method for differentiating the content. FIG. 8 is a sectional view illustrating a TiSiN film manufactured based on such process conditions.

TABLE 3

|  | TiN[x]/ SiN[y] | DCS pls [sec.] | DCS Partial Pressure [Torr] | Si Content [%] |
|---|---|---|---|---|
| TiSiN_1 | 10 | 8 | 0.1 | 12 |
| TiSiN_2 | 7 | 8 | 0.1 | 15 |
| TiSiN_3 | 28 | 8 | 0.1 | 5 |

TABLE 4

|  | TiN[x]/ SiN[y] | DCS pls [sec.] | DCS Partial Pressure [Torr] | Si Content [%] |
|---|---|---|---|---|
| TiSiN_1 | 10 | 8 | 0.1 | 12 |
| TiSiN_2 | 10 | 8 | 0.1 | 12 |
| TiSiN_3 | 28 | 8 | 0.1 | 5 |

TABLE 5

| | TiN[x]/ SiN[y] | DCS pls [sec.] | DCS Partial Pressure [Torr] | Si Content [%] |
|---|---|---|---|---|
| TiSiN_1 | 2.5 | 8 | 0.1 | 18 |
| TiSiN_2 | 28 | 8 | 0.1 | 5 |
| TiSiN_3 | 28 | 8 | 0.1 | 5 |

As shown in Tables 3 to 5, in the method for depositing the TiSiN film to have the same Si content, the three conditions required to adjust the Si content in the TiSiN film such as the TiN deposition frequency (x times)/SiN deposition frequency (y times) and the DCS supply flow may be fixed when the TiSiN film is deposited. In the method for depositing the TiSiN film to have the different Si content, the three conditions are differentiated to have the different Si content based on the TiSiN thickness.

The combinations of the Si content based on the TiSiN thickness will be as follows:

TiSiN_1=TiSiN_2=TiSiN_3;

TiSiN_1≠TiSiN_2≠TiSiN_3;

TiSiN_1=TiSiN_2≠TiSiN_3; and

TiSiN_1≠TiSiN_2≠TiSiN_3.

The thicknesses of the TiSiN_1, TiSiN_2 and TiSiN_3 may be adjustable between 2 Å and 100 Å.

Fifth Embodiment

Different amounts of $TiCl_4$, Ar, $NH_3$ and Ar are sequentially supplied on a preheated substrate for 10 seconds, 40 seconds, 60 seconds and 40 seconds, respectively. That process is repeated 14 times and a TiN thin film is formed. DCS, Ar, $NH_3$, Ar are sequentially supplied on the formed TiN thin film for 8 seconds, 40 seconds, 60 seconds and 40 seconds, respectively. That process is repeated two times and a TiSiN thin film is finally formed. The process is repeated five times and the TiSiN thin film is deposited.

In this instance, the temperature of the susceptor is 670° C. and the deposition pressure is 2 Torr. The partial pressure of the gas used in forming the TiSiN thin film is DCS: 0.1 Torr and $NH_3$:0.58 Torr.

Figure 9:
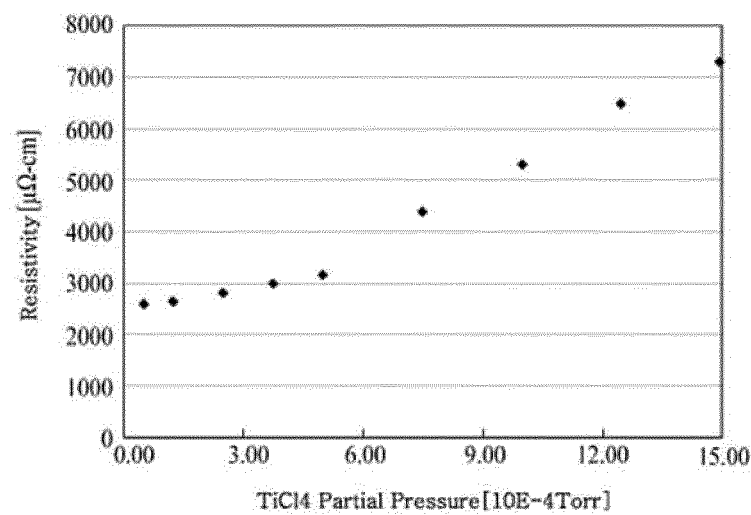
FIG. 9 is a graph showing change in resistivity of the manufactured TiSiN thin film with respect to $TiCl_4$ partial pressure in the manufacturing process.

FIG. 9 shows measured change in resistivity of the film with respect to the $TiCl_4$ supply amount to manufacture the TiSiN film mentioned above. As shown in FIG. 9, when the $TiCl_4$ partial pressure is over $6 \times 10^{-4}$ Torr, the increase of the resistivity is aggravated. Accordingly, it is sure that the $TiCl_4$ partial pressure is managed to be under $6 \times 10^{-4}$ Torr. However, the $TiCl_4$ partial pressure may be up to $9 \times 10^{-3}$ Torr based on the application range of the TiSiN thin film.

Sixth Embodiment

On the preheated substrate are sequentially supplied $TiCl_4$ for 10 seconds, Ar for 40 seconds, $NH_3$ for 60 seconds and Ar for 40 seconds. That process is repeated 14 times and a TiN thin film is formed. On the formed TiN thin film are sequentially supplied DCS for x seconds (0.4<x<30 seconds), Ar for 40 seconds, $NH_3$ for 60 seconds and Ar for 40 seconds. The process is repeated 2 times and a TiSiN thin film is finally formed. That process is repeated 5 times and the TiSiN thin film is deposited.

In this instance, the temperature of the susceptor is 670° C. and the deposition pressure is 1 Torr. Also, the partial pressure of the gas used in forming the TiSiN thin film is $TiCl_4$:$5 \times 10^{-4}$ Torr, DCS: 0.1 Torr and $NH_3$:0.58 Torr.

Figure 10:
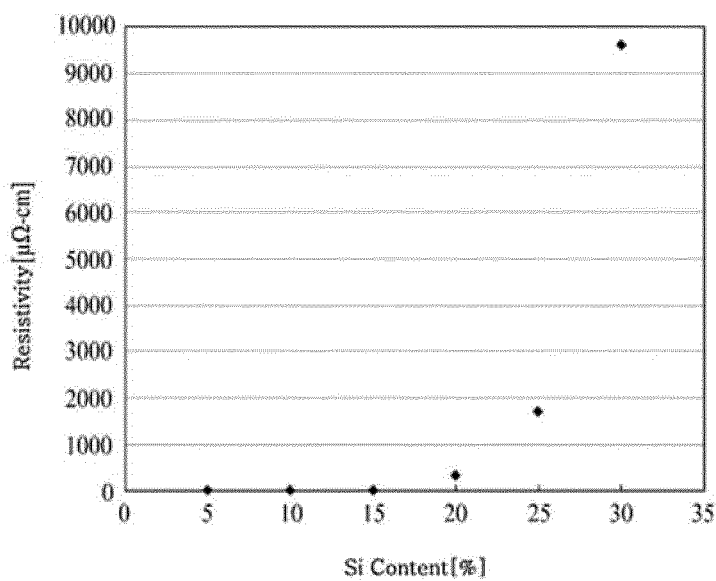
FIG. 10 is a graph showing change in resistivity values with respect to the Si content of the TiSiN film manufactured according to the method.

FIG. 10 shows measured change in a resistivity with respect to the Si content of the TiSiN film. As shown in FIG. 10, when the Si content of the TiSiN film is 20 atom % or less, a resistivity may be enhanced.

The invention claimed is:

1. A method for forming a TiSiN thin film on a substrate according to atomic layer deposition (ALD), the method comprising:
    a first process of preheating the substrate while supplying Ar or $N_2$ containing inert gas to a chamber, the first process performed after disposing the substrate in the chamber;
    a second process of forming a TiN film on the substrate, the second process comprising a first plurality of steps:
        supplying Ti containing gas for a predetermined time,
        purging oversupplied Ti containing gas by supplying an inert gas for a predetermined time after that,
        supplying N containing gas for a predetermined time after that,
        purging oversupplied residual products with an inert gas for a predetermined time after that;
    a third process of forming a SiN film, the third process comprising a second plurality of steps:
        supplying Si containing gas on the thin film for a predetermined time,
        purging oversupplied Si containing gas by supplying an inert gas for a predetermined time after that,
        supplying N containing gas for a predetermined time after that,
        purging residual products with an inert gas after that; and
    a fourth process of forming a TiSiN film having a desired thickness by repeating the second and third processes at least one time,
    wherein a partial pressure range of the gas used in forming the TiSiN thin film is Ti containing gas: $9 \times 10^{-3}$ Torr or less, Si containing gas: $1 \times 10^{-3}$ Torr to $3 \times 10^{-1}$ Torr and N containing gas: $7 \times 10^{-3}$ Torr to $6 \times 10^{-1}$ Torr, and a pressure range of the gas is 500 mTorr to 5 Torr and the Si content of the formed TiSiN thin film is 20 atom % or less,
    the method characterized in that in the second process, the first plurality of steps are repeated at least one time prior to the third process, and that in the third process, the second plurality of steps are repeated at least one time prior to the fourth process.

2. The method of claim 1, wherein the Ti containing gas is $TiCl_4$, TDMAT or TDEAT.

3. The method of claim 1, wherein the Si containing gas is $SiH_2Cl_2$, $SiHCl_3$, $SiCl_4$, $SiH_4$ or $Si_2H_6$.

4. The method of claim 1, wherein the N containing gas is $NH_3$ or MMH.

5. The method of claim 1, wherein a preheating temperature in the first process is maintained in a range from 400° C. to 700° C. and a preheating pressure in the first process is maintained in a range from 0.5 mTorr to 5Torr.

6. The method of claim 1, wherein a partial pressure of the Ti containing gas is $6 \times 10^{-4}$ Torr or less.

7. The method of claim 1, wherein a temperature of a bubbler in a supply of the Ti containing gas is maintained in a range from 0° C. to 15° C.

* * * * *